Figure 1:
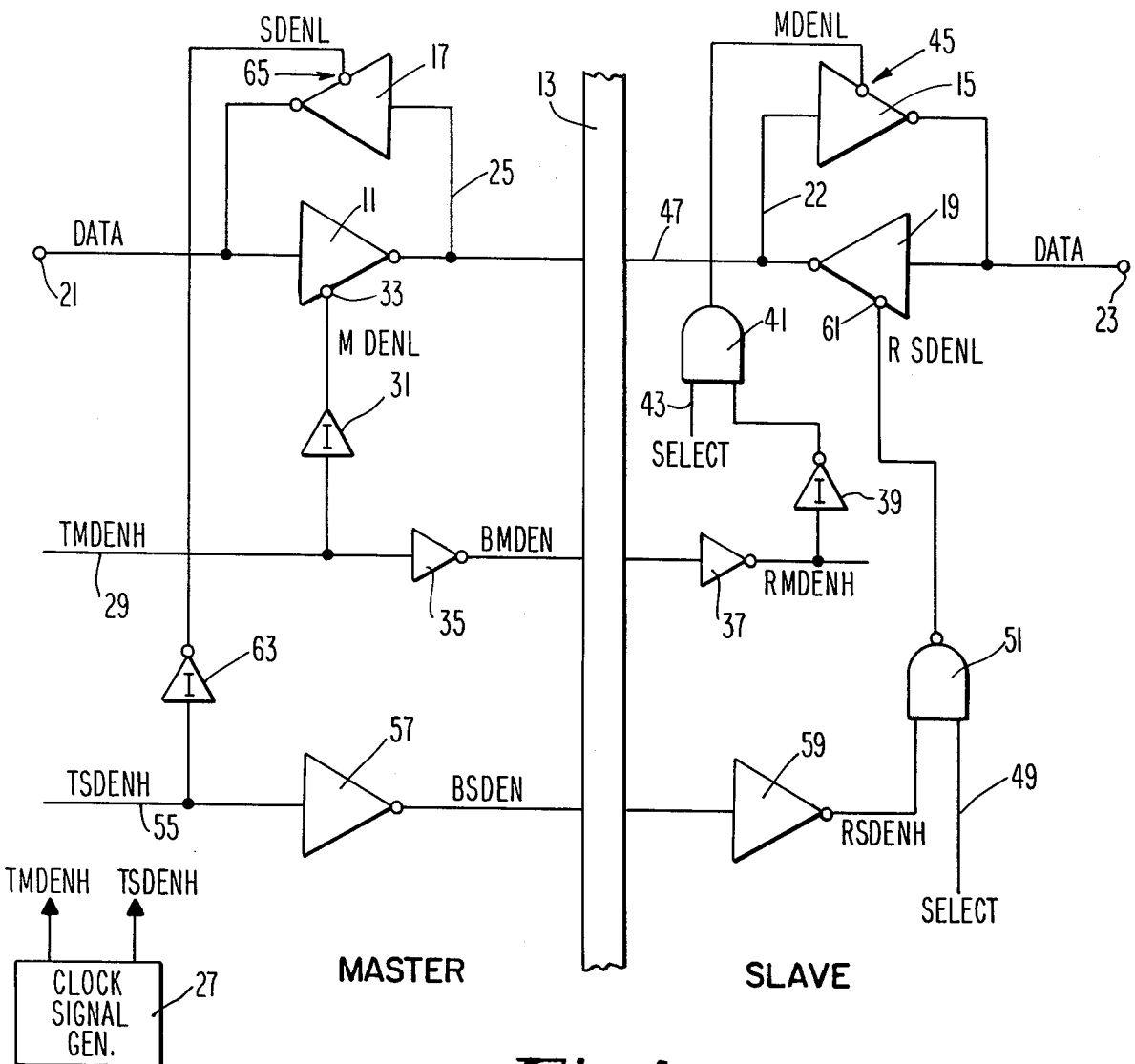

United States Patent [19]

Moore et al.

[11] 4,446,382

[45] May 1, 1984

[54] ARRANGEMENT TO TIME SEPARATE BIDIRECTIONAL CURRENT FLOW

[76] Inventors: Russell L. Moore, 21 Seneca Dr., Hudson, Middlesex County, Mass. 01749; David J. Schanin, 5 July Rd., Sudbury, Middlesex County, Mass. 01776

[21] Appl. No.: 351,720

[22] Filed: Feb. 24, 1982

[51] Int. Cl.³ .................... H03K 17/56; H03K 17/62; H03K 17/66

[52] U.S. Cl. ................................. 307/241; 328/152; 307/443

[58] Field of Search ...................... 307/443, 241, 475; 328/152; 178/71 R, 70 R

[56] References Cited

U.S. PATENT DOCUMENTS

| | | | |
|---|---|---|---|
| 3,573,635 | 4/1971 | Da Costa | 307/443 |
| 3,769,525 | 10/1973 | Foss et al. | 307/241 |
| 3,909,633 | 9/1975 | Hall | 307/443 |
| 4,012,593 | 3/1977 | Yamaguchi | 178/71 R |
| 4,154,978 | 5/1979 | Tu | 178/71 R |
| 4,158,147 | 6/1979 | Edwards | 307/241 |
| 4,315,167 | 2/1982 | Pelc | 307/443 |

Primary Examiner—John S. Heyman
Assistant Examiner—Timothy P. Callahan

[57] ABSTRACT

The present disclosure describes a circuit arrangement wherein a clock signal generator generates two sets of time-period, separated enable signals and wherein there is controllable first direction current flow circuitry and controllable second direction current flow circuitry. One set of said enable signals is connected to said first circuitry to cause current flow in a first direction during a first period of time while the other set of said enable signals is connected to said second circuitry to cause current flow in a second direction during a second period of time which is separated from said first period by a predetermined period. The arrangement insures that the circuitry will not attempt to drive current in both directions at the same time.

4 Claims, 2 Drawing Figures

ARRANGEMENT TO TIME SEPARATE BIDIRECTIONAL CURRENT FLOW

BACKGROUND

In computer systems and the like, informational signals, normally in pulse form, are transmitted along data signal paths from one section of the system to another, for instance from the central processor unit (CPU) to a tape handler. It has become popular to provide a bus device as the common bidirectional data signal path for such systems and more recently such buses have been tri state buses. A tri state bus is a bus whose lines can be driven low, high or not at all (high impedance state). When data signals are being transferred via a tri state bus, current is driven along the bus by the unit sending the data, and pulled from the bus by the unit receiving the data. The reverse is true when the receiving unit, mentioned above, becomes the sending unit and when the sending unit, above, becomes the receiving unit. Normally the sending units and receiving units are turned on, or activated, by enable signals from a clock generator (normally sent through some control circuitry). Heretofore, a single set of enable signals has been used (in conjunction with certain control signals) to turn units on. In the prior art such enable signals have been individually generated and therefore, not overlapping. Nonetheless, it has been found that under certain circumstances, a unit which is driving current in a first direction has a certain amount of current flow inertia so that after the enable signal has terminated, the unit continues to drive current thereby overlapping the time period of a subsequent enable signal. Under such circumstances, since a second unit has been enabled to drive current in a second direction, many undesirable effects occur because of the signal currents being driven in two directions simultaneously.

SUMMARY

The present invention provides a clock signal generator which is designed to provide a first enable signal, followed by a "no enable" signal period, followed by a second enable signal, followed by a "no enable" signal period and thereafter, the pattern repeats itself. In addition, the present invention provides two different direction current flow paths. There is a first set of controllable current flow devices (controllable buffers or the like) each disposed to conduct current in a first direction in response to the presence of one of said first enable signals at its control element and a second set of controllable current flow devices, each disposed to conduct current in a second direction in response to the presence of one of said second enable signals. Accordingly, the first controllable current flow devices have a period of time (during said non-enble signal period) in which the inertia (if there be any) is spent, i.e., the first controllable current flow circuit is considered to have settled down, before any or all of the second controllable current flow devices is, or are, turned on.

Figure 2:
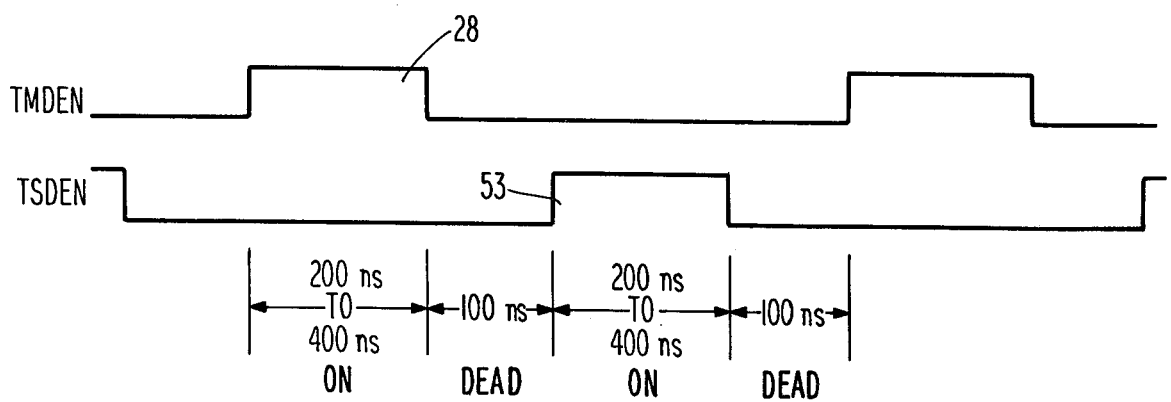

The objects and features of the present invention will be better understood in view of the following description taken in conjunction with the drawings in which:

FIG. 1 is a schematic diagram of the driving units connected for control of a two-way data flow; and FIG. 2 depicts the waveforms for the first and second enable signals.

Consider FIG. 1 which shows the control units to direct the data flow in two directions. In FIG. 1, there is shown a controllable buffer 11 connected to a D/A bus 13 (D/A meaning data/address). Also, connected to the D/A bus 13 is a controllable buffer 15. The controllable buffers 11, 15, 17 and 19 may be any of a number of commercially available buffers and in the preferred embodiment are 8307's manufactured by Advanced Micro Devices Corporation, (AMD). The D/A bus 13 is a tri-state bus meaning that it may be driven low, or high or not at all (high impedance state). When the buffers 11 and 15 are enabled, data signals will flow from the terminal 21, through the buffer 11, through particular lines in the D/A bus 13, along line 22 and through the controllable buffer 15 to the terminal 23. It should be understood that there are data signal generating units, such as IC memory devices, CPU devices, floppy disc devices, tape drive devices and the like connected to the terminals 21 and 23, to provide data signals thereto.

Note that buffer 19 is connected to receive data signals from terminal 23 and send them to the D/A bus 13. Also, note that buffer 17 receives data signals from the D/A bus 13, via the line 25 and transmits such signals to the terminal 21. Hence, the combination of the buffers 11 and 15 effect data signal flow from the master device to the slave device, while the combination of the buffers 19 and 17 effect data signal flow from the slave device to the master device.

In order to effect the two way data signal flow just described, the controllable buffers 11, 15, 17 and 19 must be enabled. In FIG. 1, there is shown a clock signal generator 27 which is shown providing two different enable signals. One enable signal is identified as TMDENH which means Transmitting, Master Data, Enable, High. The other enable signal is identified as TSDENH which means Transmitting, lave Data, En able, High. The clock signal generator 27 may be any one of a number of commercially available clock signal generators and in the preferred embodiment is a 8307 manufactured by AMD.

In FIG. 2, the waveforms of the (T) MEDN (H) and (T)SDEN(H) signals can be seen. By way of example, an examination of FIG. 2 reveals that in the preferred embodiment the MDEN and SDEN (gate pulses or gate signals) enable signals are high, or "on", for 200 to 400 nanoseconds and that the MDEN signal is separated from the SDEN signal, and vice versa, by a "dead" period of 100 nano seconds. The cycle of the two clocks signals MDEN and SDEN repeats itself in the foregoing fashion.

If data signals are to be sent from the master system to the slave system, data signals are made available at terminal 21 and during the MDEN period 28 (by way of example), a TMDENH enable signal will be applied to line 29. The TMDENH signal will pass through the inverter device 31, to provide an MDENL (L meaning low because of the inversion) signal to the control element 33. In response to the enable signal being applied to the control element 33, the data signals at terminal 21 will pass through the controllable buffer 11 to the D/A bus 13. Accordingly, current will flow from the terminal 21 to the D/A bus 13. The TMDENH signal also passes through the buffer 35 (to become a BMDEN signal) to the D/A bus 13 to be used other places in the system, where B means bus. The BMDEN signal is transmitted from the D/A bus 13 to the buffer 37, where it is amplified and becomes identified as an RMDENH, where R means received and the other letters have the meaning explained above. The (R)MDEN(H) signal is inverted at the inverter 39 to provide an MDENL (low) signal to AND gate 41. The other input to AND gate 41 is labelled "select" and means an address signal which selects the particular slave circuit shown in FIG. 1. It should be understood that while the AND gate 41 is shown in FIG. 1, the line from inverter 39 can go directly to element 45, if the system with which the present circuit is used has other provisions for selecting the slave circuits to receive data. In other words, there are normally many slave circuits operating with the master circuit and in the master circuit and in the situation we are considering, it is the intent of the program to send the data signals to terminal 23 (and the device to which terminal 23 is attached). Accordingly, the select signal on line 43 will be high to fully condition AND gate 41. The output signal from AND gate 41 is identified as RMDENL and is applied to control element 45 to enable the buffer 15. With buffer 15 enabled, the data signals from buffer 11, on the D/A bus, are transmitted along line 47, along line 22, through buffer 15 to terminal 23. Hence, by enabling the buffers 11 and 15 with an MDEN enable signal during time 28 (FIG. 2) data signals are transmitted from the master circuit to the slave circuit addressed by the address signal or select signal, on line 43.

On the other hand, when data signals are present at terminal 23, the circuit must operate to transmit data from the slave to the master. The particular slave circuit is addressed by a signal on line 49, which signal partially conditions the NAND gate 51. During the SDEN time 53, of FIG. 2, the TSDENH signal is applied from the clock signal generator 27 to line 55. The letters making up this identification were explained above. The TSDENH signal is transmitted to the buffer 57 and to the D/A bus 13 (where it is designated as a BSDEN signal). From the D/A bus 13, the BSDEN signal is transmitted to the buffer 59 and therefrom to the NAND gate 51 to fully condition that gate. The output signal from NAND gate 51 is a low signal which is transmitted to the control element 61 of the buffer 19. Accordingly, the buffer 19 is enabled and the data signals at terminal 23 are transmitted along line 47 to the D/A bus 13. Simultaneously, during SDEN time 53, there is a TSDENH signal transmitted from the line 55, through the inverter 63 to become a low signal to the control element 65 of the buffer 17. Accordingly, the buffer 17 is enabled and the data signals (from terminal 23) are transmitted from the D/A bus 13 along line 25, through the buffer 17 to the terminal 21. It becomes apparent that, during the SDEN time 53 data signals flow from the slave circuit to the master circuit.

If we re-examine FIG. 2, we note that the MDEN signal is separated timewise from the SDEN signal by a dead time of 100 nanoseconds. The dead time permits the current flow through buffer 11 to terminate in that dead time even though the MDEN 28 is no longer present. To say it another way, when buffer 11 conducts in response to the MDEN enable signal, it will be characterized by current flow inertia, in that after the enable signal 27 has terminated the current will continue to flow from the buffer 11. This phenomenon is particularly true when the buffers are used with a tri state bus. If buffer 11 were conducting, sending current into the bus and simultaneously buffer 19 were "turned on" to send current in the opposite direction into the bus, there would be (and have been in the prior art) excessive amounts of current on the bus. Spurious signals would appear in many places in response to such irregular current flow. By employing the circuit described above, by generating two separate and isolated enabling signals and by separating those enabling signals by "dead" periods, the buffer which is being turned off "settles down," or spends its current flow inertia, before the opposite flow buffer is turned on. Hence, the undesirable results of a bucking current condition on the D/A bus are eliminated.

I claim:

1. A circuit arrangement for driving electrical current signals, to and from, between a first and a second circuit, wherein said circuits are interconnected by a tri state bus device, comprising in combination: clock signal generating means formed to generate first enable signals and second enable signals, each of which types of enable signals is a gate-like type, and formed to so generate said signals (1) such that the end of any of said first enable signals occurs a predetermined time period before the beginning of a subsequent one of said second enable signals and (2) such that the end of any of said second enable signal occurs a predetermined time period before the beginning of a subsequent one of said first enable signals; first and second controllable current flow means each having a control element and disposed to be connected to each other through said tri state bus device to conduct current in a first direction in response to a first enable signal being applied to the respective control elements of each; third and fourth controllable current flow means, each having a control element and disposed to be connected to each other through said tri state bus device to conduct current in a second direction in response to a second enable signal being applied to the respective control element of each; first control circuit means connected to said clock signal generating means to receive said first enable signals and further connected to the respective control elements of said first and second controllable current flow means to cause current to be conducted therethrough during the presence of said first enable signal; and second control circuit means connected to said clock signal generating means to receive said second enable signals and further connected to the respective control elements of said third and fourth controllable current flow means to cause current to be conducted therethrough during the presence of said second enable signal, whereby the time period for current flow in said first direction is separated from the time period for current flow in said second direction, and vice versa, by said predetermined period of time.

2. A circuit arrangement for driving electrical current signals according to claim 1 wherein said first control circuit means includes a pair of buffers connected between said clock signal generating means and said second controllable current flow means and wherein said second control circuit means includes a pair of buffers connected between said clock signal generating means and said fourth controllable current means.

3. A circuit arrangement for driving electrical current signals according to claim 2 wherein said first control circuit means includes a coincident signal device connected between said second controllable current flow means and the closest one of said two buffers connected thereto and wherein said second control circuit means includes a coincident circuit device connected between said fourth controllable current flow means and the closest one of said two buffers connected thereto.

4. A circuit arrangement for driving electrical current signals according to claim 3 wherein said first and third controllable current flow means are part of a master circuit arrangement and wherein second and fourth controllable current flow means are part of a slave circuit arrangement and wherein the coincident signal device, connected to said second controllable current flow means and the coincident signal device connected to said fourth controllable current flow means, each has a select input thereto, which when activated selects the slave circuit arrangement to which data will flow from the master circuit arrangement.

* * * * *